United States Patent [19]
Dreier

[11] Patent Number: 4,607,243
[45] Date of Patent: Aug. 19, 1986

[54] COMPLEX CAPACITIVE IMPEDANCE WITH A VOLTAGE FOLLOWER CIRCUIT

[75] Inventor: Benno Dreier, Korntal, Fed. Rep. of Germany

[73] Assignee: International Standard Electric Corporation, New York, N.Y.

[21] Appl. No.: 653,373

[22] Filed: Sep. 21, 1984

[30] Foreign Application Priority Data

Sep. 22, 1983 [DE] Fed. Rep. of Germany ....... 3334243

[51] Int. Cl.⁴ .......................................... H03H 11/48
[52] U.S. Cl. ..................................... 333/214; 330/303
[58] Field of Search .................. 333/213–217; 330/102, 105, 112, 279, 302, 303

[56] References Cited

U.S. PATENT DOCUMENTS

| | | | |
|---|---|---|---|
| 2,691,106 | 10/1954 | Woodbury | 333/214 X |
| 3,243,740 | 3/1966 | Sziklai | 333/214 |
| 3,831,117 | 8/1974 | Fletcher et al. | 333/214 |
| 3,886,469 | 5/1973 | Rollett et al. | 333/214 X |
| 4,025,867 | 5/1977 | Seidel | 328/127 |
| 4,137,466 | 1/1979 | Schemmel et al. | 333/213 X |
| 4,424,499 | 1/1984 | Kiko | 333/214 X |
| 4,532,384 | 7/1985 | Keriakes et al. | 333/217 X |

FOREIGN PATENT DOCUMENTS 3009118 9/1981 Fed. Rep. of Germany ...... 333/213
0120317 7/1983 Japan .................................. 333/213

OTHER PUBLICATIONS

Ramsey W. T.; "Highpass & Bandpass Filters Using a New Single and Simulated Inductor"; *Electronic Circuits and Systems*; May 1978, vol. 2, No. 3; pp. 79–83.
Bhattachoryga et al.; An Improved Design of Voltage Follower Circuits Using op Amps; *21st Midwest Symposian on Circuit and Systems*; Ames Iowa, Aug. 14–15, 1978.

*Primary Examiner*—Eugene R. LaRoche
*Assistant Examiner*—Benny Lee
*Attorney, Agent, or Firm*—John T. O'Halloran; Thomas F. Meagher

[57] ABSTRACT

A complex capacitive impedance (Z) whose capacitance value is considerably larger than the total capacitance of the components used in it is implemented by connecting a capacitive impedance (Z3) in series with a first resistor (R1) to form a voltage divider, and bypassing the first resistor (R1) with a voltage follower circuit (SFS).

2 Claims, 4 Drawing Figures

COMPLEX CAPACITIVE IMPEDANCE WITH A VOLTAGE FOLLOWER CIRCUIT

The present invention relates to a complex capacitive impedance.

In many fields of practical application, especially with integrated circuits, there exists the technical problem of simulating capacitive impedances in such a way that the capacitance value of the actually used capacitor is considerably lower than the total capacitance of the impedance as it appears to the circuit outside the complex capacitance impedance.

Capacitance multipliers are known for producing such impedances (e.g. U.S. Pat. No. 3,831,117). One such multiplier comprises a differential amplifier having one input terminal connected to an input junction by a first resistive means, an output terminal connected to a second input terminal by a second resistive means and to the input junction by a third resistive means, and an impedance means connected between the one input terminal of the amplifier and a fixed reference potential, usually circuit ground. Accordingly, the capacitance multiplier represents a four-terminal network, with the capacitive component necessarily lying in the shunt arm to the signal flow at a fixed potential.

Complex capacitive impedances suitable for use as potential-free two-terminal networks, that is, through which normally an AC signal is to be transmitted in both directions at respectively the same total impedance, however, cannot be realized with the aid of these capacitance multipliers which are connected to a fixed potential.

One advantage of the complex capacitive impedance according to the invention resides in that this circuit can be used as a potential-free pure two-terminal network which transmits an AC signal in both directions, with the same complex total impedance being effective in both directions of transmission.

Two embodiments will now be explained in more detail with reference to the accompanying drawings, in which.

Figure 1:
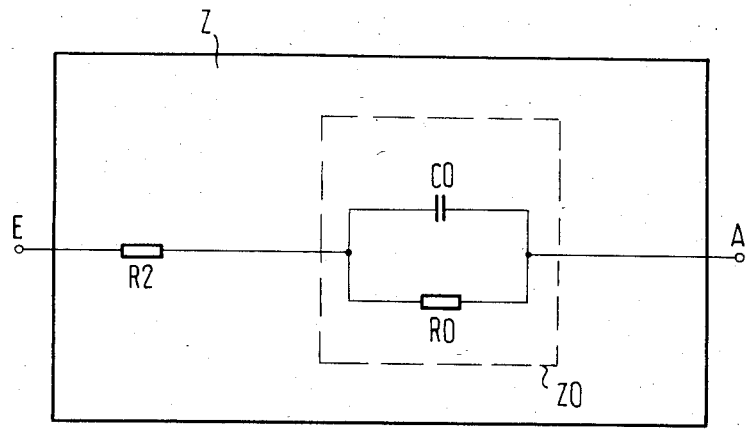
FIG. 1 shows a conventional circuit of a complex capacitive impedance.

In FIG. 1, one terminal, E, of a conventional complex capacitive two-terminal impedance is connected to a resistor R2 and, through an impedance Z0 connected in series with the resistor and formed by a parallel RC section R0, C0, to the other terminal, A. The impedance value Z is given by $$Z = R2 + Z0. \quad (1)$$

Figure 2:
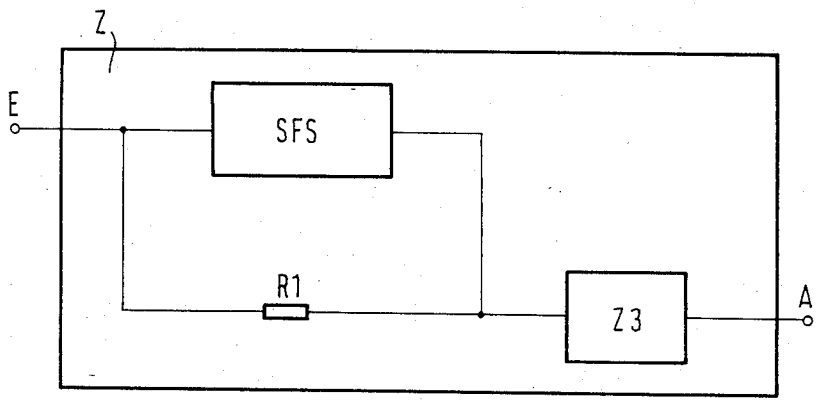
FIG. 2 is a block diagram of the complex capacitive impedance in accordance with the invention.

The block diagram of FIG. 2 shows a complex capacitve impedance Z which contains, in accordance with the invention, a capacitive impedance Z3 in series with a resistor R1 shunted by a voltage follower circuit SFS.

Figure 3:
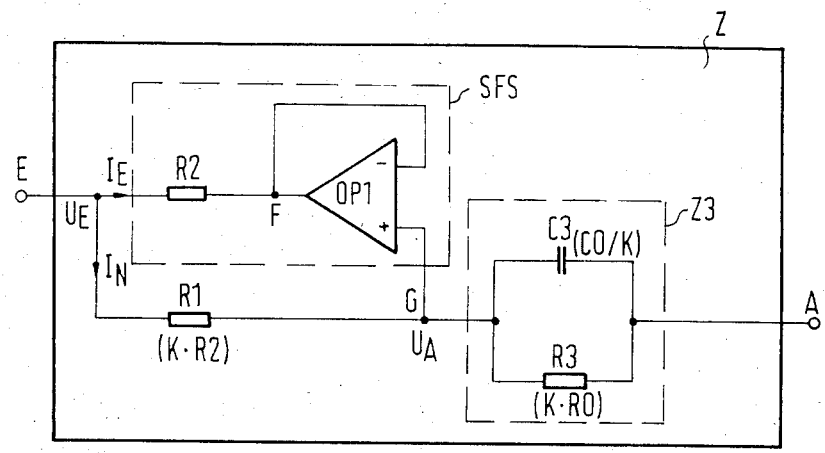
FIG. 3 is a first circuit diagram of a complex capacitive impedance in accordance with the invention.

FIG. 3 shows a first detailed embodiment.

One terminal, A, is connected to an impedance Z3, consisting of a resistor R3 in parallel with a capacitor C3. The impedance Z3 and a resistor R1 form a voltage divider whose center tap G is connected to the noninverting input of an operational amplifier OP1 connected as a voltage follower. The output F of the operational amplifier OP1 is connected through a resistor R2 to the other terminal, E, and to that end of the resistor R1 which is not connected to the center tap G. If the values of the resistor R1 and the impedance Z3 are $$R1 = K \cdot R2 \quad (2)$$

$$Z3 = K \cdot Z0, \quad (3)$$

the values of R3 and C3 are $$R3 = K \cdot R0 \quad (4)$$

$$C3 = C0/K \quad (5).$$

To obtain the largest possible ratio of the impedance capacitance to the capacitance of the capacitive components used, the factor K is chosen to be quite large, e.g., K=100. Thus, the value of the resistor R1 is considerably larger than that of the resistor R2, and the current $I_N$ through resistor R1 is negligible compared with the current $I_E$ through resistor R2. This simplifies the calculation of the complex capacitive impedance considerably.

The impedance Z is $$Z = U_E/I_E \quad (6)$$

where $$I_E = \frac{U_E - U_A}{R2} \quad (7)$$

The division ratio of the voltage divider is $$\frac{U_A}{U_E} = \frac{K \cdot Z0}{K \cdot (R2 + Z0)} \quad (8)$$

Substituting Eqs. (7) and (8) into Eq. (6) gives:

$$Z = R2 + Z0 \quad (9).$$

The value of the impedance Z of FIG. 1 is not changed by the arrangement according to the invention. What has changed, however, is the value of the necessary capacitance to be introduced by a component, which is now $$C3 = C0/K, \quad (10)$$

which corresponds to a substantial reduction of the original capacitance C0 if the factor K is large.

For the calculation, nearly exclusively large factors K are of interest since the capacitive components used should have as small capacitance values as possible to permit the complex capacitive impedance Z to be realized as an integrated circuit.

Figure 4:
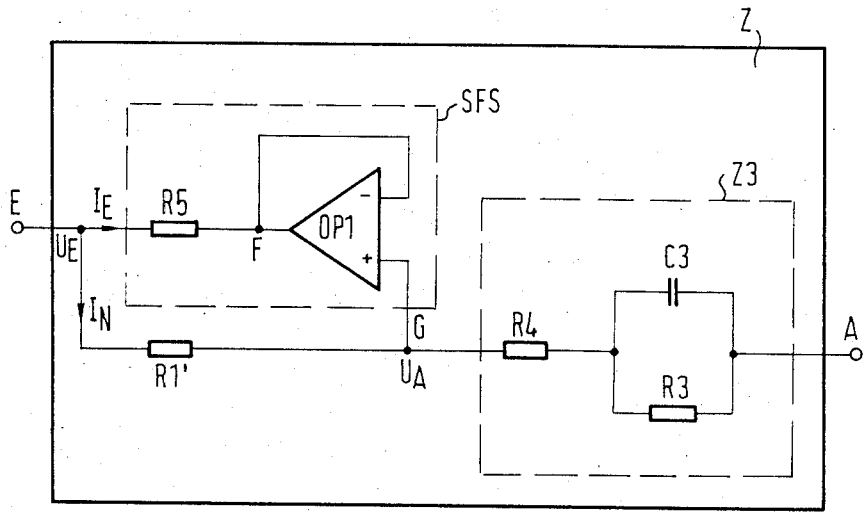
FIG. 4 is a second circuit diagram of a complex capacitive impedance in accordance with the invention.

A second embodiment is shown in FIG. 4. Instead of the total resistance R1 of the voltage divider, only a portion of the resistance R1, designated in FIG. 4 by R1', is shunted by the voltage follower circuit SFS. The remainder of the resistance R1 is connected as a resistance R4 in the impedance Z3 in series with the parallel RC section C3, R3. To prevent any change in the total value of the complex capacitive impedance Z, the value of the resistor R2 according to (2) and (8) is reduced by the value of the resistor R4. This gives an actually smaller output resistance R5 of the circuit with unchanged total impedance Z. Such a variant of the circuit can be used to advantage if a smaller output resistance R5 of the operational amplifier OP1 is desired.

I claim:

1. A complex capacitive impedance comprising:

a first node (e);

a first resistor (R1) having one end connected to said node;

a capacitive impedance (Z3) connected in a series between the other end of said first resistor (R1) and a second node (A) such that said capacitive impedance (Z3) and said first resistor (R1) form a voltage divider;

a voltage follower circuit (SFS) connected to said first node and in parallel with said first resistor (R1), said voltage follower circuit comprising an operational amplifier (OPI), the noninverting input of said operational amplifier being connected to a second node (G) located between the other end of said first resistor (RI) and said capacitive impedance and the inverting input of said operational amplifier being connected by a shunt wire to the output of said operational amplifier, and a second resistor (R2, R5) connected at one end to said first node and at the other end to the output of said operational amplifier, wherein said capacitive impedance (Z3) comprises a combination of a third resistor (R4) in a series with a combination of a fourth resistor (R3) and a capacitor (C3), wherein said fourth resistor (R3) is made having a large enough value that said capacitor (C3) has a value considerably lower than that total capacitance of said complex capacitive impedance as said complex capacitive impedance appears to said first node (E).

2. A complex capacitive impedance comprising:

a first node (E);

a first resistor (R1) having one end connected to said node;

a capacitive impedance (Z3) connected in a series between the other end of said first resistor (R1) and a second node (A) such that said capacitive impedance (Z3) and said first resistor (R1) form a voltage divider;

a voltage follower circuit (SFS) connected to said first node and in parallel with said first resistor (R1), said voltage follower circuit comprising an operational amplifier (OPI), the noninverting input of said operational amplifier being connected to a second node (G) located between the other end of said first resistor (RI) and said capacitive impedance and the inverting input of said operational amplifier being connected by a shunt wire to the output of said operational amplifier, and a second resistor (R2, R5) connected at the one end to said first node and at the other end to the output of said operational amplifier, wherein said capacitive impedance (Z3) comprises a parallel combination of a third resistor (R3) and a capacitor (C3), wherein said third resistor (R3) is made having a large enough value that said capacitor (C3) has a value considerably lower than the total capacitance of said complex capacitive impedance as said complex capacitive impedance appears to said first node (E).

* * * * *